United States Patent
Mikami et al.

(10) Patent No.: US 8,828,626 B2
(45) Date of Patent: Sep. 9, 2014

(54) SUBSTRATE WITH REFLECTIVE LAYER FOR EUV LITHOGRAPHY AND REFLECTIVE MASK BLANK FOR EUV LITHOGRAPHY

(71) Applicant: Asahi Glass Company, Limited, Tokyo (JP)

(72) Inventors: Masaki Mikami, Tokyo (JP); Takeru Kinoshita, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 75 days.

(21) Appl. No.: 13/727,305

(22) Filed: Dec. 26, 2012

(65) Prior Publication Data

US 2013/0115547 A1    May 9, 2013

Related U.S. Application Data

(63) Continuation of application No. PCT/JP2011/066993, filed on Jul. 26, 2011.

(30) Foreign Application Priority Data

Jul. 27, 2010   (JP) ................................ 2010-168298

(51) Int. Cl.
    *G03F 1/24* (2012.01)
    *G03F 1/22* (2012.01)

(52) U.S. Cl.
    USPC ............................................................. 430/5

(58) Field of Classification Search
    USPC ................. 430/5, 311, 312, 313; 378/35
    See application file for complete search history.

(56) References Cited

U.S. PATENT DOCUMENTS 7,736,821 B2   6/2010  Hayashi et al.
7,833,682 B2   11/2010 Hayashi et al.
(Continued)

FOREIGN PATENT DOCUMENTS

JP      3366572       11/2002
JP    2003-318104    11/2003
(Continued)

OTHER PUBLICATIONS

U.S. Appl. No. 13/937,771, filed Jul. 9, 2013, Mikami.
(Continued)

*Primary Examiner* — Stephen Rosasco
(74) *Attorney, Agent, or Firm* — Oblon, Spivak, McClelland, Maier & Neustadt, L.L.P.

(57) ABSTRACT

To provide an EUV mask blank whereby deterioration in reflectance due to oxidation of a Ru protective layer is suppressed, a functional film-attached substrate to be used for the production of the EUV mask blank, and a process for producing the functional film-attached substrate. A substrate with a reflective layer for EUV lithography, comprising a substrate, and a reflective layer for reflecting EUV light and a protective layer for protecting the reflective layer formed in this order on the substrate, wherein the reflective layer is a Mo/Si multilayer reflective film, the protective layer is a Ru layer or a Ru compound layer, between the reflective layer and the protective layer, an interlayer is formed which is composed of a first layer containing from 0.5 to 25 at % of nitrogen and from 75 to 99.5 at % of Si, and a second layer containing from 60 to 99.8 at % of Ru, from 0.1 to 10 at % of nitrogen and from 0.1 to 30 at % of Si and which has a total thickness of the first and second layers being from 0.2 to 2.5 nm, the first layer constituting the interlayer is formed on the reflective layer side, and the second layer is formed on the first layer, and the protective layer contains substantially no Si.

20 Claims, 1 Drawing Sheet

(56) References Cited

U.S. PATENT DOCUMENTS

| | | |
|---|---|---|
| 7,906,259 B2 | 3/2011 | Hayashi et al. |
| 8,088,538 B2 | 1/2012 | Hayashi et al. |
| 2003/0008180 A1 | 1/2003 | Bajt et al. |
| 2003/0198874 A1 | 10/2003 | Lee |
| 2006/0270226 A1 | 11/2006 | Hosoya |
| 2009/0042110 A1* | 2/2009 | Matsuo et al. ............... 430/5 |
| 2012/0196208 A1 | 8/2012 | Mikami et al. |
| 2012/0219890 A1 | 8/2012 | Mikami |
| 2012/0225375 A1 | 9/2012 | Mikami |
| 2012/0231378 A1 | 9/2012 | Mikami et al. |

FOREIGN PATENT DOCUMENTS

| | | |
|---|---|---|
| JP | 2005-516182 | 6/2005 |
| JP | 2005-268750 | 9/2005 |
| JP | 2005-286203 | 10/2005 |
| JP | 2006-332153 | 12/2006 |
| JP | 2007-273356 | 10/2007 |
| JP | 2008-159605 | 7/2008 |
| JP | 4158960 | 7/2008 |
| JP | 4346656 | 7/2009 |
| JP | 2009-260183 | 11/2009 |
| JP | 4418700 | 12/2009 |
| JP | 4613499 | 10/2010 |
| JP | 2011-23592 | 2/2011 |

OTHER PUBLICATIONS

International Search Report issued Aug. 23, 2011 in PCT/JP2011/066993 filed Jul. 26, 2011.
U.S. Appl. No. 14/134,433, filed Dec. 19, 2013, Kinoshita, et al.
U.S. Appl. No. 14/182,688, filed Feb. 18, 2014, Kinoshita.

* cited by examiner

SUBSTRATE WITH REFLECTIVE LAYER FOR EUV LITHOGRAPHY AND REFLECTIVE MASK BLANK FOR EUV LITHOGRAPHY

TECHNICAL FIELD

The present invention relates to a reflective mask blank for EUV (Extreme Ultraviolet) lithography (hereinafter, referred to as "EUV mask blank" in this specification) to be used for semiconductor manufacturing or the like, a substrate with a reflective layer for EUV lithography to be used for production of the EUV mask blank, and an EUV mask obtained by patterning the EUV mask blank.

BACKGROUND ART

In the semiconductor industry, a photolithography method using visible light or ultraviolet light has been employed as a technique for transferring, on a silicon substrate or the like, a fine pattern, which is required for forming an integrated circuit comprising such a fine pattern. However, the conventional exposure techniques using light exposure have been close to the limit of the conventional photolithography method while semiconductor devices have had finer patterns at an accelerated pace. In the case of the photolithography method, it is said that the resolution limit of a pattern is about ½ of an exposure wavelength, and that even if an immersion method is employed, the resolution limit is about ¼ of an exposure wavelength. Even if an immersion method using an ArF laser (wavelength: 193 nm) is employed, it is estimated that the resolution limit is about 45 nm. From this point of view, EUV lithography, which is an exposure technique using EUV light having a wavelength further shorter than the ArF laser, has been considered as being promising as the next generation of exposure technique using an exposure wavelength shorter than 45 nm. In this specification, the term "EUV light" means a ray having a wavelength in a soft X ray region or a vacuum ultraviolet ray region, specifically a ray having a wavelength of about 10 to 20 nm, in particular, of about 13.5 nm±0.3 nm.

It is impossible to use EUV light in conventional dioptric systems as in photolithography using visible light or ultraviolet light, since EUV light is apt to be absorbed by any substances and since the refractive index of the substances is close to 1 at the above wavelength. For this reason, a catoptric system, i.e., a combination of a reflective photomask and a mirror, is employed in EUV light lithography.

A mask blank is a stacked member to be used for fabrication of a photomask, which has not been patterned yet. In the case of an EUV mask blank, it has a structure wherein a substrate made of glass or the like has a reflective layer for reflecting EUV light and an absorber layer for absorbing EUV light, formed thereon in this order. The reflective layer is usually a Mo/Si multilayer reflective film, which comprises silicon (Si) layers as high refractive layers and molybdenum (Mo) layers as low refractive layers alternately stacked to increase a light reflectance when the layer surface is irradiated with EUV light. Hereinafter, in this specification, the reflective layer comprising silicon (Si) layers as high refractive layers and molybdenum (Mo) layers as low refractive layers alternately stacked in a plurality of layers, will be referred to also as a Mo/Si multilayer reflective film.

The absorber layer is made of a material having a high absorption coefficient to EUV light, specifically, for example, a material containing chromium (Cr) or tantalum (Ta) as the main component.

Between the reflective layer and the absorber layer, usually a protective layer is formed. The protective layer is provided for the purpose of protecting the reflective layer so that the reflective layer will not be damaged by an etching process to be carried out for the purpose of forming a pattern on the absorber layer. Patent Document 1 proposes to use ruthenium (Ru) as the material of the protective layer. Patent Document 2 proposes a protective layer made of a ruthenium compound (Ru content of from 10 to 95 at %) containing Ru and at least one member selected from Mo, Nb, Zr, Y, B, Ti and La.

PRIOR ART DOCUMENTS

Patent Documents

Patent Document 1: JP-A-2002-122981
Patent Document 2: JP-A-2005-268750

DISCLOSURE OF THE INVENTION

Technical Problem

In a case where Ru is used as the material of the protective layer, a high etching selectivity for the absorber layer will be obtained and further, a high reflectance will be obtained even in a case where the protective layer is formed on a reflective layer and the surface of the protective layer is irradiated with EUV light. However, in a case where Ru is used as the material of the protective layer, there will be a problem that the reflectance of EUV light tends to decrease, when the surface of the protective layer is irradiated with EUV light, since the Ru protective layer and further the outermost layer of the multilayer reflective film (i.e. the Si layer in the case of the Mo/Si multilayer reflective film) are likely to be oxidized in a step to be carried out for production of a mask blank or in a step to be carried out for production of a photomask from the mask blank (such as a cleaning, heating, dry etching or defect-correcting step), or during EUV exposure.

Particularly, since the decrease in the reflectance during EUV exposure proceeds with time, it will be required to change the exposure conditions during operation, or the life of the mask may be shortened, such being problematic.

Hereinafter, in this specification, such a decrease in the reflectance of EUV light when the surface of the protective layer is irradiated with EUV light, since the Ru protective layer and further the outermost layer of the multilayer reflective film are oxidized in a step to be carried out for production of a mask blank or in a step to be carried out for production of a photomask from the mask blank (such as a cleaning, heating, dry etching or defect-correcting step), or during EUV exposure, may be referred to simply as "the decrease in the reflectance of EUV light due to oxidation of the Ru protective layer".

The protective layer disclosed in Patent Document 2, is described to provide a sufficient antioxidant effect to the multilayer reflective film without bringing about a decrease in the reflectance of the multilayer reflective film, but as is evident from the disclosure in paragraph [0006] in the same Document, the decrease in the reflectance of the multilayer reflective film mentioned here is meant for a decrease in the reflectance by forming a diffusion layer between the Ru protective layer and the outermost layer of the multilayer reflective film during the film formation of the Ru protective layer or a subsequent heat treatment, and it is not clear whether the decrease in the reflectance of EUV light due to oxidation of the Ru protective layer, as mentioned above, is meant.

In view of the foregoing background, it is an object of the present invention to provide an EUV mask blank whereby deterioration in reflectance of EUV light due to oxidation of a Ru protective layer is suppressed, and a functional film-attached substrate to be used for the production of such an EUV mask blank.

Solution to Problem

The present inventors have conducted an extensive study to solve the above problem and as a result, have found it possible to suppress the decrease in the reflectance of EUV light due to oxidation of a Ru protective layer, by forming an interlayer of a double layer structure composed of a first layer containing predetermined amounts of nitrogen and Si and a second layer containing predetermined amounts of Ru, nitrogen and Si, between a Mo/Si multilayer reflective layer and the Ru protective layer.

The present invention has been made based on the above discovery by the present inventors and provides a substrate with a reflective layer for EUV lithography (hereinafter referred to also as "the substrate with a reflective layer of the present invention" in this specification), comprising a substrate, and a reflective layer for reflecting EUV light and a protective layer for protecting the reflective layer formed in this order on the substrate, wherein the reflective layer is a Mo/Si multilayer reflective film, the protective layer is a Ru layer or a Ru compound layer, between the reflective layer and the protective layer, an interlayer is formed which is composed of a first layer containing from 0.5 to 25 at % of nitrogen and from 75 to 99.5 at % of Si, and a second layer containing from 60 to 99.8 at % of Ru, from 0.1 to 10 at % of nitrogen and from 0.1 to 30 at % of Si and which has a total thickness of the first and second layers being from 0.2 to 2.5 nm, the first layer constituting the interlayer is formed on the reflective layer side, and the second layer is formed on the first layer, and the protective layer contains substantially no Si.

In the substrate with a reflective layer of the present invention, it is preferred that the first layer has a thickness of from 0.1 to 2.4 nm, the second layer has a thickness of from 0.1 to 2.4 nm, and the difference in thickness between the second layer and the first layer (i.e. thickness of the second layer-thickness of the first layer) is from 0 to 2.3 nm.

In the substrate with a reflective layer of the present invention, it is preferred that the surface roughness (rms) on the surface of the protective layer is at most 0.5 nm. Here, the surface roughness (rms) is meant for root-mean-square surface roughness and is referred to also as surface roughness Rq.

In the substrate with a reflective layer of the present invention, it is preferred that the protective layer has a thickness of from 1 to 10 nm.

Further, the present invention provides a reflective mask blank for EUV lithography (hereinafter referred to also as "the EUV mask blank of the present invention"), comprising the substrate with a reflective layer of the present invention and an absorber layer formed on the protective layer of the substrate.

In the EUV mask blank of the present invention, it is preferred that the absorber layer is formed of a material containing tantalum (Ta) as the main component.

In the EUV mask blank of the present invention, it is preferred that the etching selectivity for the absorber layer to the protective layer at the time of carrying out dry etching by means of chlorine type gas as etching gas, is at least 10.

In the EUV mask blank of the present invention, it is preferred that a low reflective layer to inspection light to be used for inspection of a mask pattern is formed of a material containing tantalum (Ta) as the main component on the absorber layer.

In the EUV mask blank of the present invention, it is preferred that in the case where the low reflective layer is formed on the absorber layer, the contrast is at least 30% as between the reflected light on the surface of the protective layer and the reflected light on the surface of the low reflective layer at a wavelength of light to be used for inspection of a pattern to be formed on the absorber layer.

Further, the present invention provides a reflective mask for EUV lithography (hereinafter referred to also as "the EUV mask of the present invention") obtained by patterning the EUV mask blank of the present invention.

Further, the present invention provides a method for producing a semiconductor integrated circuit, which comprises subjecting an object to be exposed, to exposure by means of the above EUV mask of the present invention, to produce the semiconductor integrated circuit.

In this specification, "to" is used to include the numerical values before and after it as the lower limit value and the upper limit value, unless otherwise specified.

Advantageous Effects of Invention

According to the substrate with a reflective layer of the present invention and the EUV mask blank using it, the decrease in the reflectance of EUV light due to oxidation of the Ru protective layer is suppressed.

The EUV mask to be prepared by using the EUV mask blank of the present invention is a highly reliable EUV mask whereby the change with time in the reflectance of EUV light is small.

DESCRIPTION OF EMBODIMENTS

Now, the EUV mask blank of the present invention will be described with reference to the drawings.

Figure 1:
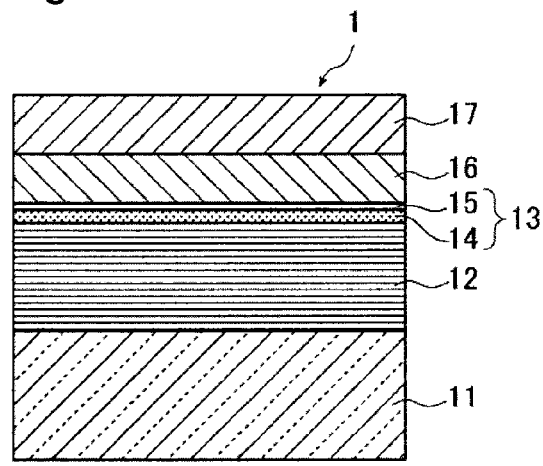
FIG. 1 is a cross-sectional view schematically illustrating an embodiment of an EUV mask blank of the present invention.

FIG. 1 is a cross-sectional view schematically illustrating one embodiment of the EUV mask blank of the present invention. A mask blank 1 shown in FIG. 1 comprises a substrate 11, and a reflective layer 12 for reflecting EUV light and a protective layer 16 for protecting the reflective layer 12 formed in this order on the substrate 11. However, in the EUV mask blank of the present invention, between the reflective layer 12 and the protective layer 16, an interlayer 13 of a double layer structure is formed which is composed of a first layer 14 containing the after-mentioned predetermined amounts of nitrogen and Si, and a second layer 15 containing the after-mentioned predetermined amounts of Ru, nitrogen and Si. On the protective layer 16, an absorber layer 17 is formed.

In the present invention, the first layer 14 is formed on the reflective layer 12 side, and the second layer 15 is formed on the first layer 14.

Now, the respective constituents in the mask blank 1 will be described.

The substrate 11 is required to satisfy properties as a substrate for an EUV mask blank. Accordingly, the substrate 11 preferably has a low thermal expansion coefficient (for example, the thermal expansion coefficient within a temperature range of from 19° C. to 27° C. is preferably $0\pm1.0\times10^{-7}/°$ C., more preferably $0\pm0.3\times10^{-7}/°$ C., furthermore preferably $0\pm0.2\times10^{-7}/°$ C., still more preferably $0\pm0.1\times10^{-7}/°$ C., particularly preferably $0\pm0.05\times10^{-7}/°$ C.). Further, the substrate 11 is preferably one being excellent in smoothness, flatness and resistance to a cleaning liquid to be used for cleaning e.g. a mask blank or a photomask after formation of a pattern. As the substrate 11, specifically, glass having a low thermal expansion coefficient, such as a $SiO_2$—$TiO_2$ glass may be used, but the substrate is not limited thereto, and a substrate made of crystallized glass with a β quartz solid solution precipitated therein, quartz glass, silicon, metal or the like may also be used. Further, a film such as a stress correcting film may be formed on the substrate 11.

The substrate 11 preferably has a smooth surface having a surface roughness (rms) of at most 0.15 nm and a flatness of at most 100 nm, with a view to obtaining a high reflectance and printing precision with a photomask after pattern formation.

The dimensions, the thickness, etc. of the substrate 11 are properly determined according to the designed values, etc. for a mask. In Examples described hereinafter, a $SiO_2$—$TiO_2$ glass having outer dimensions of 6 inch (152.4 mm) square and a thickness of 0.25 inch (6.3 mm) was used.

It is preferred that no defects are present on the surface of the substrate 11 on a side where the multilayer reflective layer 12 is formed. However, even when defects are present, it is preferred that the depth of the concave defects and the height of the convex defects are at most 2 nm and that the half value width of the size in the plane direction of the concave defects and the convex defects is at most 60 nm, in order that no phase defects are formed by the concave defects and/or the convex defects.

The property that is particularly required for the reflective layer 12 of the EUV mask blank is that it has a high EUV light reflectance. Specifically, when the reflective layer 12 is irradiated with a ray in the wavelength range of the EUV light at an angle of incidence of 6°, the maximum reflectance to light having a wavelength in the vicinity of 13.5 nm is preferably at least 60%, more preferably at least 65%. Further, even when an interlayer 13 of a double layer structure (i.e. first layer 14 and second layer 15) and a protective layer 16 are formed on the reflective layer 12, the maximum reflectance to light having a wavelength in the vicinity of 13.5 nm is preferably at least 60%, more preferably at least 65%.

As the reflective layer of an EUV mask blank, a multilayer reflective film having high refractive index layers and low refractive index layers alternately stacked a number of times is commonly used, since it is thereby possible to accomplish a high reflectance in the EUV wavelength region. In the EUV mask blank of the present invention, a Mo/Si multilayer reflective film is used wherein Si layers as high refractive index layers and Mo layers as low refractive index layers are alternately stacked a number of times.

In the case of a Mo/Si multilayer reflective film, in order to let the reflective layer 12 have a maximum EUV light reflectance of at least 60%, Mo layers having a thickness of 2.3±0.1 nm and Si layers having a thickness of 4.5±0.1 nm may be alternately stacked so that the number of repeating units becomes from 30 to 60.

The respective layers constituting the Mo/Si multilayer reflective film may be formed to have desired thicknesses by a known film deposition method such as magnetron sputtering method or ion beam sputtering method. For example, in the case of forming a Mo/Si multilayer reflective film by ion beam sputtering method, it is preferred to deposit a Mo layer so as to have a thickness of 2.3 nm, using a Mo target as the target and an Ar gas (having a gas pressure of from $1.3\times10^{-2}$ Pa to $2.7\times10^{-2}$ Pa) as the sputtering gas with an ion acceleration voltage of from 300 to 1,500 V at a deposition rate of from 0.03 to 0.30 nm/sec and then to deposit a Si layer so as to have a thickness of 4.5 nm, using a Si target as the target and an Ar gas (having a gas pressure of $1.3\times10^{-2}$ Pa to $2.7\times10^{-2}$ Pa) as the sputtering gas, with an ion acceleration voltage of from 300 to 1,500 V at a deposition rate of from 0.03 to 0.30 nm/sec. By stacking Si layers and Mo layers in 40 to 50 cycles, each of the cycles comprising the above steps, the Mo/Si multilayer reflective film is deposited.

In the EUV mask blank of the present invention, between the reflective layer 12 and the protective layer 16, an interlayer 13 of a double layer structure is formed which is composed of a first layer 14 containing from 0.5 to 25 at % of nitrogen and from 75 to 99.5 at % of Si, and a second layer 15 containing from 60 to 99.8 at % of Ru, from 0.1 to 10 at % of nitrogen and from 0.1 to 30 at % of Si, so as to suppress the decrease in the EUV light reflectance due to oxidation of the Ru protective layer. The reason as to why it is possible to suppress the decrease in the EUV light reflectance due to oxidation of the Ru protective layer by forming the interlayer 13 of the double layer structure (first layer 14 and second layer 15) having the above compositions, between the reflective layer 12 and the protective layer 16, is considered to be as follows.

The interlayer of the above double layer structure is considered to provide a high reflectance after film deposition and to have an effect to suppress oxidation, as the first layer 14 has the content of nitrogen suppressed to such an extent that a decrease in reflectance will not occur due to a large amount of nitrogen contained in the Si film.

And, the second layer 15 contains, in addition to Ru, a very small amount of nitrogen, whereby even in such a situation that the Ru protective layer is likely to be oxidized, it is possible to suppress oxidation of a layer structure present beneath the second layer. Thus, even in such a situation that the Ru protective layer is likely to be oxidized in a step to be carried out during production of a mask blank or in a step to be carried out at the time of producing a photo-mask from the mask blank (such as a cleaning, defect inspection, heating, dry etching or defect correcting step), or during the EUV exposure, by the presence of the interlayer 13 having an effect to suppress oxidation, it is considered possible to suppress oxidation of the Mo/Si multilayer reflective film present beneath the interlayer 13, more specifically to suppress oxidation of the Si film as the upper most layer of the Mo/Si multilayer reflective film, and consequently, it is possible to suppress the decrease in the EUV light reflectance due to oxidation of the Ru protective layer.

Further, by the presence of the interlayer 13 of the above double layer structure between the reflective layer 12 (Mo/Si multilayer reflective film) and the protective layer 16 (Ru protective layer), it is possible to prevent diffusion, in the Ru protective layer, of Si in the Si film as the upper most layer of the Mo/Si multilayer reflective film during the formation of the protective layer 16.

In the present invention, the first layer 14 in the interlayer 13 is formed in contact with the upper most layer of the reflective layer 12, and the second layer 15 is formed on the first layer.

If the content of nitrogen in the first layer 14 is less than 0.5 at %, the above-mentioned effect to suppress further oxidation tends to be inadequate, and an effect to suppress the decrease in the EUV light reflectance due to oxidation of the Ru protective layer tends to be inadequate.

As described later in detail, in the present invention, the interlayer 13 of the above-mentioned double layer structure can be formed by exposing, after forming a Mo/Si multilayer reflective film, the surface of a Si film as the uppermost layer of the Mo/Si multilayer reflective film to a nitrogen-containing atmosphere. However, in a case where the content of nitrogen in the first layer 14 exceeds 25 at %, it is considered that nitrogen has been added during film deposition of the Si film as the uppermost layer of the Mo/Si multilayer reflective film or during film deposition of the protective layer 16 formed on the interlayer 13, or during film deposition of both of them, and such film deposition to add nitrogen creates a problem, since defects during the film deposition increase.

The first layer 14 preferably contains from 0.5 to 15 at % of nitrogen and from 85 to 99.5 at % of Si, more preferably contains from 0.5 to 10 at % of nitrogen and from 80 to 99.5 at % of Si, further preferably contains from 1 to 9 at % of nitrogen and from 91 to 99 at % of Si, still further preferably contains from 3 to 9 at % of nitrogen and from 91 to 97 at % of Si, particularly preferably contains from 5 to 8 at % of nitrogen and from 92 to 95 at % of Si.

If the content of Ru in the second layer 15 is less than 60 at %, there is a problem of a decrease in the EUV light reflectance due to oxidation of the Ru protective layer. On the other hand, if the content of Ru in the second layer 15 exceeds 98.5 at %, the above-mentioned effect of containing a very small amount of nitrogen tends to be hardly obtainable.

If the content of nitrogen in the second layer 15 is less than 0.1 at %, the above-mentioned effect of containing a very small amount of nitrogen tends to be hardly obtainable. On the other hand, if the content of nitrogen in the second layer 15 exceeds 10 at %, there will be a problem of a decrease in the EUV light reflectance due to excessive nitriding of the Ru protective layer.

If the content of Si in the second layer 15 is less than 0.1 at %, the adhesion to the first layer 14 is likely to be poor. On the other hand, if the content of Si in the second layer 15 exceeds 30 at %, there will be a problem of a decrease in the EUV light reflectance due to oxidation of the Ru protective layer.

The second layer 15 preferably contains from 60 to 99.8 at % of Ru, from 0.1 to 10 at % of nitrogen and from 0.1 to 30 at % of Si, more preferably contains from 75 to 99.8 at % of Ru, from 0.1 to 5 at % of nitrogen and from 0.1 to 20 at % of Si, and further preferably contains from 90 to 99.8 at % of Ru, from 0.1 to 2.5 at % of nitrogen and from 0.1 to 7.5 at % of Si.

The first layer 14 and the second layer 15 constituting the interlayer 13 preferably do not contain fluorine, since otherwise, Si in the respective layers (first layer 14 and second layer 15) constituting the interlayer 13 is likely to be eroded. Further, the respective layers (first layer 14 and second layer 15) constituting the interlayer 13 preferably do not contain carbon or hydrogen, since if carbon or hydrogen is contained in the respective layers (first layer 14 and second layer 15) constituting the interlayer 13, it may react with oxygen contained in the respective layers (first layer 14 and second layer 15) constituting the interlayer 13, whereby oxygen in the layers are likely to be discharged. For such reasons, the contents of fluorine, carbon and hydrogen in the respective layers (first layer 14 and second layer 15) constituting the interlayer 13 are, respectively, preferably at most 3 at %, more preferably at most 1 at %. Further, likewise, the content of an element such as Ni, Y, Ti, La, Cr or Rh in the respective layers (first layer 14 and second layer 15) constituting the interlayer 13 is preferably at most 3 at %, more preferably at most 1 at %.

In the present invention, the total thickness of the first layer 14 and the second layer 15 constituting the interlayer 13 is preferably from 0.2 to 2.5 nm, more preferably from 0.4 to 2 nm, further preferably from 0.5 to 1.5 nm, from the viewpoint of the effect to suppress the decrease in the EUV light reflectance due to oxidation of the Ru protective layer. Further, the thickness of the Si layer as the uppermost layer of the multilayer reflective film is preferably from 2 to 4.8 nm, particularly preferably from 2.5 to 4 nm, in order to form the interlayer 13 of the above double layer structure by exposure to a nitrogen-containing atmosphere.

In the present invention, the thickness of the first layer 14 is preferably from 0.1 to 2.4 nm, more preferably from 0.4 to 1.5 nm, further preferably from 0.8 to 1.3 nm, from the viewpoint of the effect to suppress the decrease in the EUV light reflectance due to oxidation of the Ru protective layer.

In the present invention, the thickness of the second layer 15 is preferably from 0.1 to 2.4 nm, more preferably from 0.4 to 1.5 nm, further preferably from 0.8 to 1.2 nm, from the viewpoint of the effect to suppress the decrease in the EUV light reflectance due to oxidation of the Ru protective layer.

In the present invention, among the respective layers (first layer 14 and second layer 15) constituting the interlayer 13, the thickness of the first layer 14 is preferably small, with a view to suppressing the decrease in the EUV light transmittance due to excessive nitriding of the SiN layer.

In the present invention, the difference in thickness between the second layer 15 and the first layer 14 (thickness of the second layer 15–thickness of the first layer 14) is preferably from 0 to 2.3 nm, more preferably from 0 to 1.1 nm, further preferably from 0 to 0.4 nm.

In the present invention, the first layer 14 in the interlayer 13 of the above double layer structure, can be formed by exposing, after forming a Mo/Si multilayer reflective film, the surface of a Si film as the uppermost layer of the Mo/Si multilayer reflective film to a nitrogen-containing atmosphere thereby to slightly nitride the Si film surface. Here, in this specification, the nitrogen-containing atmosphere means a nitrogen gas atmosphere or a mixed gas atmosphere of nitrogen gas and an inert gas such as argon.

In the present invention, the exposure of the Si film surface to the nitrogen-containing atmosphere is preferably such that the product of nitrogen partial pressure (Torr) and exposure time (s) is at least $1 \times 10^{-6}$ Torr·s (=1 L (Langmuir)). The product of nitrogen partial pressure and exposure time is an index showing the frequency of impingement of nitrogen in the nitrogen-containing atmosphere to the Si film surface, and hereinafter in this specification, it may be referred to as "the amount of nitrogen exposure". This value is preferably at $1 \times 10^{-6}$ Torr·s, more preferably at least $1 \times 10^{-3}$ Torr·s, further preferably at least $1 \times 10^{-2}$ Torr·s, still further preferably at least $1 \times 10^{-1}$ Torr·s, in order to form the first layer 14 for the interlayer 13 of the above-mentioned double layer structure, by nitriding of the Si film surface.

So long as the exposure of the Si film surface to the nitrogen-containing atmosphere satisfies the above condition, the procedure for exposing the Si film surface to the nitrogen-containing atmosphere is not particularly limited. However, like the procedure shown in Examples 1 and 2, a procedure of exposing the Si film surface to nitrogen gas or to a mixed gas of nitrogen gas and an inert gas such as argon, in a reduced pressure atmosphere, is a preferred procedure in consideration of such a point that in a case where deposition of a multilayer reflective film and deposition of a protective layer are carried out by using the same chamber, it is required to discharge the nitrogen gas (or the mixed gas of nitrogen gas and an inert gas such as argon) in the chamber before carrying out deposition of the protective layer after carrying out the procedure of exposing the Si film surface to the nitrogen gas (or the mixed gas of nitrogen gas and an inert gas such as argon). Further, this procedure is a preferred procedure also from such a viewpoint that the nitrogen content in the respective layers (first layer 14 and second layer 15) constituting the interlayer 13 can be controlled by controlling the amount of exposure of nitrogen gas (or the mixed gas of nitrogen gas and an inert gas such as argon) to the Si film surface.

Further, in the case of exposing the Si film surface to nitrogen gas or to a mixed gas of nitrogen gas and an inert gas such as argon in a reduced pressure atmosphere, it is preferred to maintain the reduced pressure atmosphere in a plasma state in order to accelerate nitriding of the Si film surface. Even in such a case, if a voltage is applied to nitrogen gas (or a mixed gas of nitrogen gas and an inert gas such as argon) ionized in the plasma state thereby to apply ion irradiation to the Si film surface, ionized nitrogen is likely to be impinged to the Si film surface in an accelerated state, whereby nitriding of the Si film is likely to proceed excessively to cause a decrease in the EUV light reflectance of the Mo/Si multilayer reflective film. Therefore, it is particularly preferred not to apply a voltage to the nitrogen gas (or the mixed gas of nitrogen gas and an inert gas such as argon) ionized in the plasma state, i.e. not to apply ion irradiation, in that the nitrogen content in the respective layers (first layer 14 and second layer 15) constituting the interlayer 13 can be controlled to a proper level.

In the present invention, the temperature of the nitrogen-containing atmosphere to which the Si film surface is exposed, is preferably from 0 to 150° C. If the temperature of the nitrogen-containing atmosphere is lower than 0° C., a problem of an influence due to adsorption of the remaining moisture in vacuum is likely to occur. If the temperature of the nitrogen-containing atmosphere exceeds 150° C., nitriding of the Si film is likely to proceed excessively to cause a decrease in the EUV light reflectance of the Mo/Si multilayer reflective film.

The temperature of the nitrogen-containing atmosphere is more preferably from 10 to 140° C., further preferably from 20 to 120° C.

In the present invention, a second layer containing RuSiN is formed on the first layer of SiN for the interlayer, by depositing a protective layer 16 (Ru protective layer) after exposing the Si film surface as the uppermost layer of the Mo/Si multilayer reflective film to form the interlayer 13 of the above-mentioned double layer structure. Here, the protective layer 16 may be deposited to have a desired thickness by means of a well known deposition method such as a magnetron sputtering method or an ion beam sputtering method. For example, in a case where the Ru protective layer is to be formed by means of an ion beam sputtering method, it is preferred to deposit a Ru layer so that the thickness will be from 1 to 10 nm at an ion accelerating voltage of from 300 to 1,500 V at a deposition rate of from 0.03 to 0.30 nm/sec by using a Ru target as the target and Ar gas (gas pressure: $1.3 \times 10^{-2}$ Pa to $2.7 \times 10^{-2}$ Pa) as the sputtering gas. As a result, it is possible to improve the oxidation durability without a decrease in the EUV light reflectance, such being desirable.

In Examples 1 and 2 given hereinafter, the time for exposing the Si film surface to the nitrogen-containing atmosphere is 600 sec and 6,000 sec, respectively, but the time for exposing the Si film surface to the nitrogen-containing atmosphere is not limited thereto and may suitably be selected within a range to satisfy the above-described conditions relating to the nitrogen-containing atmosphere.

The protective layer 16 is provided for the purpose of protecting the reflective layer 12 so that the reflective layer 12 will not be damaged by an etching process, at the time of forming a pattern on the absorber layer 17 by an etching process, usually, a dry etching process. Accordingly, the material for the protective layer 16 is selected to be a material which is less susceptible to the influence by the etching process of the absorber layer 17 i.e. the etching rate of which is slower than the absorber layer 17, and yet which is scarcely damaged by the etching process.

Further, the protective layer 16 is preferably such that the protective layer 16 itself has a high EUV light reflectance, so that even after forming the protective layer 16, it will not impair the EUV light reflectance at the reflective layer 12.

In the present invention, in order to satisfy the above conditions, as the protective layer 16, a Ru layer or a Ru compound layer may, for example, be formed. As the Ru compound, at least one member selected from the group consisting of RuB, RuZr and RuNb is, for example, preferred.

However, the protective layer 16 is required to contain substantially no Si, since such is preferred in order to suppress the decrease in the EUV light reflectance due to oxidation of the Ru protective layer. Here, "the protective layer 16 contains substantially no Si" means that the Si content in the protective layer 16 is at most 0.5 at %, preferably at most 0.3 at %, further preferably at most 0.1 at %.

In the present invention, the surface roughness (rms) of the surface of the protective layer 16 is preferably at most 0.5 nm. If the surface roughness of the surface of the protective layer 16 is large, the surface roughness of the absorber layer 17 to be formed on the protective layer 16 tends to be large, whereby the edge roughness of a pattern to be formed on the absorber layer 17 tends to be large, and the dimensional accuracy of the pattern tends to be poor. As the pattern becomes fine, the influence of the edge roughness becomes distinct, and therefore, the surface of the absorber layer 17 is required to be flat and smooth.

When the surface roughness (rms) of the surface of the protective layer 16 is at most 0.5 nm, the surface of the absorber layer 17 to be formed on the protective layer 16 will be sufficiently flat and smooth, whereby there will be no deterioration of the dimensional accuracy of a pattern due to an influence of the edge roughness. The surfaced roughness (rms) of the protective layer 16 is more preferably at most 0.4 nm, further preferably at most 0.3 nm.

The thickness of the protective layer 16 is preferably from 1 to 10 nm for such a reason that it is thereby possible to increase the EUV light reflectance and to obtain an etching resistant property. The thickness of the protective layer 16 is more preferably from 1 to 5 nm, further preferably from 2 to 4 nm.

The protective layer 16 can be deposited by means of a well known deposition method such as a magnetron sputtering method or an ion beam sputtering method.

In a case where a Ru layer is to be formed as the protective layer 16 by means of an ion beam sputtering method, electrical discharge may be carried out in an argon (Ar) atmosphere by using a Ru target as the target. Specifically, ion beam sputtering may be carried out under the following conditions.

Sputtering gas: Ar (gas pressure: $1.0 \times 10^{-1}$ to $10 \times 10^{-1}$ Pa, preferably $1.0 \times 10^{-1}$ to $5.0 \times 10^{-1}$ Pa, more preferably $1.0 \times 10^{-1}$ to $3.0 \times 10^{-1}$ Pa).

Electric power applied (for each target): 30 to 1000 W, preferably 50 to 750 W, more preferably 80 to 500 W.

Deposition rate: 0.1 to 6 nm/sec, preferably 0.1 to 4.5 nm/sec, more preferably 0.1 to 3 nm/sec Here, the state before forming the absorber layer of the EUV mask blank of the present invention, i.e. the structure excluding the absorber layer 17 from the mask blank 1 shown in FIG. 1, is the substrate with a reflective layer of the present invention. The substrate with a reflective layer of the present invention constitutes a precursor for the EUV mask blank.

The substrate with a reflective layer of the present invention is preferably such that when the surface of the protective layer 16 is cleaned with ozone water in accordance with the procedure disclosed in Examples given hereinafter, the decrease in the EUV light reflectance between before and after the cleaning is preferably at most 0.9%, more preferably at most 0.5%.

The substrate with a reflective layer of the present invention is preferably such that when heat treatment is carried out in accordance with the procedure disclosed in Examples given hereinafter, the decrease in the EUV light reflectance between before and after the heat treatment is preferably at most 7%, more preferably at most 6%.

Further, the reason as to why the decrease in the EUV light reflectance between before and after the heat treatment is large as compared with the decrease in the EUV light reflectance between before and after the cleaning with ozone water, is such that in order to confirm the effect of the present invention, in Examples given hereinafter, heat treatment was carried out under severer conditions than the heating step carried out at the time of producing a mask blank or the heating step carried out at the time of producing a photomask from the mask blank.

The property especially required for the absorber layer 17 is that the EUV light reflectance is very low. Specifically, when the surface of the absorber layer 17 is irradiated with a ray in a wavelength region of EUV light, the maximum light reflectance in the vicinity of a wavelength of 13.5 nm is preferably at most 0.5%, more preferably at most 0.1%.

In order to obtain such a property, the absorber layer is preferably made of a material having a high EUV light absorption coefficient, and it is preferably formed of a material containing tantalum (Ta) as the main component.

As such an absorber layer 17, one containing Ta, B, Si and nitrogen (N) in a ratio as described below (TaBSiN film) may be mentioned.

Content of B: at least 1 at % and less than 5 at %, preferably from 1 to 4.5 at %, more preferably from 1.5 to 4 at %.

Content of Si: from 1 to 25 at %, preferably from 1 to 20 at %, more preferably from 2 to 12 at %.

The compositional ratio of Ta to N (Ta:N) (atomic ratio): from 8:1 to 1:1.

Content of Ta: preferably from 50 to 90 at %, more preferably from 60 to 80 at %.

Content of N: preferably from 5 to 30 at %, more preferably from 10 to 25 at %.

The absorber layer 17 having the above composition in an is amorphous state and is excellent in the surface smoothness.

The absorber layer 17 having the above composition has a surface roughness (rms) of at most 0.5 nm. If the surface roughness of the surface of the absorber layer 17 is large, the edge roughness of a pattern to be formed on the absorber layer 17 tends to be large, and the dimensional accuracy of the pattern tends to be poor. As the pattern becomes fine, the influence of the edge roughness becomes distinct, and therefore, the surface of the absorber layer 17 is required to be flat and smooth.

When the surface roughness (rms) of the surface of the absorber layer 17 is at most 0.5 nm, the surface of the absorber layer 17 is sufficiently flat and smooth, and there will be no deterioration of the dimensional accuracy of a pattern due to an influence of the edge roughness. The surface roughness (rms) of the surface of the absorber layer 17 is more preferably at most 0.4 nm, further preferably at most 0.3 nm.

The absorber layer 17 has the above-described construction, whereby the etching rate is high when subjected to dry etching by using a chlorine type gas as the etching gas, and it is preferably one showing an etching selectivity of at least 10 to the protective layer 16. In this specification, the etching selectivity can be calculated by using the following formula.

Etching selectivity=(etching rate of absorber layer 17)/(etching rate of protective layer 16)

The etching selectivity is preferably at least 10, more preferably at least 11, further preferably at least 12.

The thickness of the absorber layer 17 is preferably from 50 to 100 nm. The absorber layer 17 having the above-described construction can be formed by means of a well known film deposition method, e.g. a sputtering method such as a magnetron sputtering method or an ion beam sputtering method. In a case where a magnetron sputtering method is employed, the absorber layer 17 can be formed by any one of the following methods (1) to (3).

(1) Using a Ta target, a B target and a Si target, the respective targets are simultaneously discharged in an atmosphere of nitrogen ($N_2$) diluted with Ar to form the absorber layer 17.

(2) Using a TaB compound target and a Si target, these targets are simultaneously discharged in an atmosphere of $N_2$ diluted with Ar to form the absorber layer 17.

(3) Using a TaBSi compound target, the target having these three elements combined is discharged in an atmosphere of $N_2$ diluted with Ar to form the absorber layer 17.

Among the above-described methods, in the methods ((1) and (2)) of discharging two or more targets simultaneously, the composition of the absorber layer 17 to be formed, can be controlled by adjusting the electric power applied to the respective targets.

Among the above methods, the methods (2) and (3) are preferred with a view to avoiding unstable discharge or variation in the composition or thickness of the film, and the method (3) is particularly preferred. The TaBSi compound target particularly preferably has a composition of Ta=50 to 94 at %, Si=5 to 30 at % and B=1 to 20 at %, with a view to avoiding unstable discharge and variation in the composition or thickness of the film.

To form the absorber layer 17 by the above methods, specifically, film deposition may be carried out under the following deposition conditions.

[Method (2) using TaB Compound Target and Si Target]

Sputtering gas: mixed gas of Ar and $N_2$ ($N_2$ gas concentration: 3 to 80 vol %, preferably 5 to 30 vol %, more preferably 8 to 15 vol %).

Gas pressure: $1.0 \times 10^{-1}$ Pa to $10 \times 10^{-1}$ Pa, preferably $1.0 \times 10^{-1}$ Pa to $5 \times 10^{-1}$ Pa, more preferably $1.0 \times 10^{-1}$ Pa to $3 \times 10^{-1}$ Pa).

Electric power applied (for each target): 30 to 1000 W, preferably 50 to 750 W, more preferably 80 to 500 W.

Deposition rate: 2.0 to 60 nm/sec, preferably 3.5 to 45 nm/sec, more preferably 5 to 30 nm/sec

[Method (3) Using TaBSi Compound Target]

Sputtering gas: mixed gas of Ar and $N_2$ ($N_2$ gas concentration: 3 to 80 vol %, preferably 5 to 30 vol %, more preferably 8 to 15 vol %).

Gas pressure: $1.0 \times 10^{-1}$ Pa to $10 \times 10^{-1}$ Pa, preferably $1.0 \times 10^{-1}$ Pa to $5 \times 10^{-1}$ Pa, more preferably $1.0 \times 10^{-1}$ Pa to $3 \times 10^{-1}$ Pa)

Electric power applied: 30 to 1000 W, preferably 50 to 750 W, more preferably 80 to 500 W.

Figure 2:
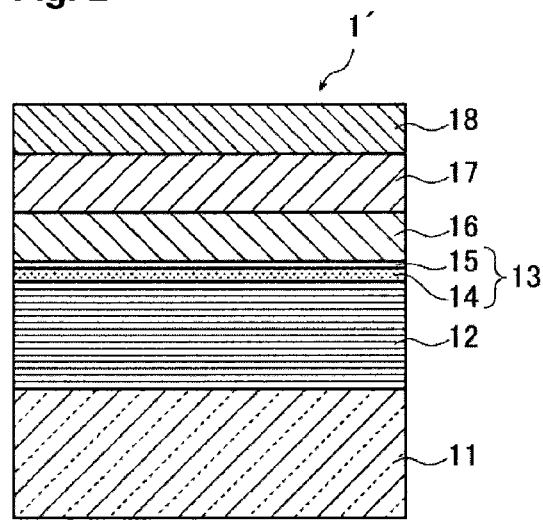
FIG. 2 is a cross-sectional view schematically illustrating an embodiment of an EUV mask blank of the present invention, which has a low reflective layer formed on an absorber layer.

Deposition rate: 2.0 to 60 nm/sec, preferably 3.5 to 45 nm/sec, more preferably 5 to 30 nm/sec The EUV mask blank of the present invention preferably has, like EUV mask blank 1' as shown in FIG. 2, a low reflective layer 18 to inspection light to be used for inspection of a mask pattern, formed on the absorber layer 17.

At the time of preparation of an EUV mask, after a pattern is formed on the absorber layer, the EUV mask is inspected whether the pattern is formed as designed. For inspection of the mask pattern, an inspection machine usually employing a light at a wavelength of about 257 nm as inspection light is used. That is, the EUV mask is inspected by the difference in the reflectance to this light at a wavelength of about 257 nm, specifically by the difference in the reflectance between on the exposed face from which the absorber layer 17 is removed by the pattern formation and on the surface of the absorber layer 17 remaining without being removed by pattern formation. The former face corresponds to the surface of the protective layer 16. Thus, if the difference in the reflectance between on the surface of the protective layer 16 and on the surface of the absorber layer 17 to light at a wavelength of the inspection light is small, the contrast tends to be poor at the time of inspection and accurate inspection will not be conducted.

The absorber layer 17 having the above-described structure has a very low EUV light reflectance and has excellent properties as the absorber layer for the EUV mask blank, but with respect to the wavelength of the inspection light, its light reflectance is not necessarily sufficiently low. Thus, the difference between the reflectance on the surface of the absorber layer 17 and the reflectance on the surface of the protective layer 16 at a wavelength of the inspection light is small, and no sufficient contrast may be obtained at the time of inspection. If no sufficient contrast can be obtained at the time of inspection, defects of the pattern cannot sufficiently be judged at the time of mask inspection, and the defect test cannot be conducted accurately.

Like EUV mask blank 1' shown in FIG. 2, by forming a low reflective layer 18 on the absorber layer 17, a good contrast will be obtained at the time of inspection, that is, the light reflectance at the wavelength of the inspection light becomes very low. The low reflective layer 18 formed for such a purpose has, when irradiated with a ray in the wavelength range of the inspection light, a maximum light reflectance at the wavelength of the inspection light of preferably at most 15%, more preferably at most 10%, furthermore preferably at most 5%.

When the low reflective layer 18 has a light reflectance of at most 15% at a wavelength of the inspection light, a good contrast at the time of inspection will be obtained. Specifically, the contrast between the reflected light at a wavelength of the inspection light on the surface of the protective layer 16 and the reflected light at a wavelength of the inspection light on the surface of the low reflective layer 18, will be at least 40%.

In this specification, the contrast can be determined by the following formula.

Contrast (%)=(($R_2-R_1$)/($R_2+R_1$))×100

Here, $R_2$ at a wavelength of the inspection light is the reflectance on the surface of the protective layer 16, and $R_1$ is the reflectance on the surface of the low reflective layer 18.

Figure 3:
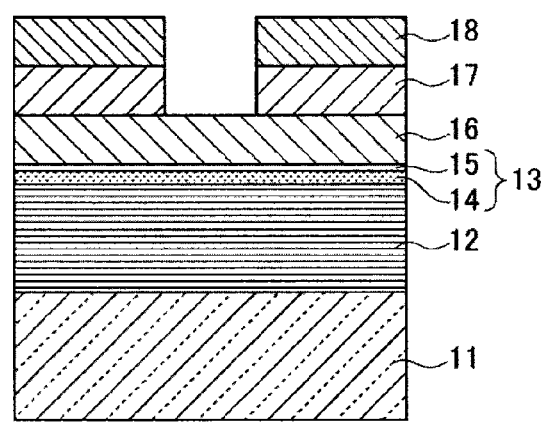
FIG. 3 illustrates a state where a pattern is formed on an absorber layer 17 (and a low reflective layer 18) of an EUV mask blank 1' shown in FIG. 2.

The above $R_1$ and $R_2$ are measured in a state where a pattern is formed on the absorber layer 17 and the low reflective layer 18 of the EUV mask blank 1' shown in FIG. 2 (i.e. a state shown in FIG. 3). The above $R_2$ is a value measured on the surface of the protective layer 16 exposed to the outside, from which the absorber layer 17 and the low reflective layer 18 are removed by pattern formation in FIG. 3, and $R_1$ is a value measured on the surface of the low reflective layer 18 remaining without being removed by pattern formation.

In the present invention, the contrast represented by the above formula is more preferably at least 45%, furthermore preferably at least 60%, particularly preferably at least 80%.

The low reflective layer 18 is preferably made of a material presenting a lower refractive index at a wavelength of the inspection light than that of the absorber layer 17, and it is preferably in an amorphous state in order to achieve the above properties.

As a specific example of such a low reflective layer 18, one containing Ta, B, Si and oxygen (O) in the following contents (low reflective layer (TaBSiO)) may be mentioned.

B content: at least 1 at % and less than 5 at %, preferably 1 to 4.5 at %, more preferably 1.5 to 4 at %.

Si content: 1 to 25 at %, preferably 1 to 20 at %, more preferably 2 to 10 at %.

Compositional ratio of Ta to O (Ta:O) (atomic ratio): 7:2 to 1:2, preferably 7:2 to 1:1, more preferably 2:1 to 1:1.

Further, as a specific example of the low reflective layer 18, one containing Ta, B, Si, O and N in the following ratio (low reflective layer (TaBSiON)) may be mentioned.

B content: at least 1 at % and less than 5 at %, preferably 1 to 4.5 at %, more preferably 2 to 4.0 at %.

Si content: 1 to 25 at %, preferably 1 to 20 at %, more preferably 2 to 10 at %.

Compositional ratio of Ta to O and N (Ta:(O+N)) (atomic ratio): 7:2 to 1:2, preferably 7:2 to 1:1, more preferably 2:1 to 1:1

The low reflective layer (TaBSiO) or (TaBSiON) having the above structure is in an amorphous state and has a surface excellent in smoothness. Specifically, the surface roughness (rms) on the surface of the low reflective layer (TaBSiO) or (TaBSiON) is at most 0.5 nm.

As described above, the surface of the absorber layer 17 is required to be smooth, in order to prevent deterioration of the dimensional accuracy of the pattern by the influence of the edge roughness. Since the low reflective layer 18 is formed on the absorber layer 17, its surface is required to be smooth from the same reason.

When the surface roughness (rms) on the surface of the low reflective layer 18 is at most 0.5 nm, the dimensional accuracy of the pattern will not be deteriorated by the influence of the edge roughness, since the surface of the low reflective layer 18 is sufficiently smooth. The surface roughness (rms) on the surface of the low reflective layer 18 is more preferably at most 0.4 nm, furthermore preferably at most 0.3 nm.

In the case of forming the low reflective layer 18 on the absorber layer 17, the total thickness of the absorber layer 17 and the low reflective layer 18 is preferably from 55 to 130 nm. Further, the low reflective layer 18 is preferably thinner than the absorber layer 17 since the EUV light absorption properties of the absorber layer 17 may decrease if the low reflective layer 18 is thicker than the absorber layer 17. Accordingly, the thickness of the low reflective layer 18 is preferably from 5 to 30 nm, more preferably from 10 to 20 nm.

The low reflective layer (TaBSiO) or (TaBSiON) can be formed by a well known film deposition method, e.g. sputtering such as magnetron sputtering method or ion beam sputtering method. In the case of magnetron sputtering method, the low reflective layer (TaBSiO) can be formed by any of the following methods (1) to (3).

(1) Using a Ta target, a B target and a Si target, the respective targets are simultaneously discharged in an atmosphere of oxygen ($O_2$) diluted with argon (Ar) to form the low reflective layer (TaBSiO).

(2) Using a TaB compound target and a Si target, these targets are simultaneously discharged in an atmosphere of oxygen diluted with argon to form the low reflective layer (TaBSiO).

(3) Using a TaBSi compound target, the target having these three elements combined is discharged in an atmosphere of oxygen diluted with argon to form the low reflective layer (TaBSiO).

Among the above described methods, in the methods ((1) and (2)) of discharging two or more targets simultaneously, the composition of the low reflective layer (TaBSiO) to be formed can be controlled by adjusting the electric power applied to the respective targets.

Among the above methods, the methods (2) and (3) are preferred with a view to avoiding unstable discharge or variation in the composition or thickness of the film, and the method (3) is particularly preferred. The TaBSi compound target particularly preferably has a composition of Ta=50 to 94 at %, Si=5 to 30 at % and B=1 to 20 at %, with a view to avoiding unstable discharge and variation in the composition or thickness of the film.

In a case where the low reflective layer (TaBSiON) is to be formed, the same procedure as above is carried out in an atmosphere of an oxygen/nitrogen gas mixture diluted with argon instead of in an atmosphere of oxygen diluted with argon.

To form the low reflective layer (TaBSiO) by the above method, specifically, film deposition is carried out under the following deposition conditions.

[Method (2) Using TaB Compound Target and Si Target]

Sputtering gas: mixed gas of Ar and $O_2$ ($O_2$ gas concentration: 3 to 80 vol %, preferably 5 to 30 vol %, more preferably 8 to 15 vol %, Gas pressure: $1.0\times10^{-1}$ Pa to $10\times10^{-1}$ Pa, preferably $1.0\times10^{-1}$ Pa to $5\times10^{-1}$ Pa, more preferably $1.0\times10^{-1}$ Pa to $3\times10^{-1}$ Pa)

Electric power applied (for each target): 30 to 1,000 W, preferably 50 to 750 W, more preferably 80 to 500 W Deposition rate: 2.0 to 60 nm/sec, preferably 3.5 to 45 nm/sec, more preferably 5 to 30 nm/sec

[Method (3) Using TaBSi Compound Target]

Sputtering gas: mixed gas of Ar and $O_2$ ($O_2$ gas concentration: 3 to 80 vol %, preferably 5 to 30 vol %, more preferably 8 to 15 vol %, Gas pressure: $1.0\times10^{-1}$ Pa to $10\times10^{-1}$ Pa, preferably $1.0\times10^{-1}$ Pa to $5\times10^{-1}$ Pa, more preferably $1.0\times10^{-1}$ Pa to $3\times10^{-1}$ Pa)

Electric power applied: 30 to 1,000 W, preferably 50 to 750 W, more preferably 80 to 500 W Deposition rate: 2.0 to 50 nm/sec, preferably 2.5 to 35 nm/sec, more preferably 5 to 25 nm/sec To form the low reflective layer (TaBSiON) by the above method, specifically, film deposition is carried out under the following film deposition conditions.

[Method (2) Using TaB Compound Target and Si Target]

Sputtering gas: mixed gas of Ar, $O_2$ and $N_2$ ($O_2$ gas concentration: 5 to 30 vol %, $N_2$ gas concentration: 5 to 30 vol %, preferably O2 gas concentration: 6 to 25 vol %, $N_2$ gas concentration: 6 to 25 vol %, more preferably $O_2$ gas concentration: 10 to 20 vol %, $N_2$ gas concentration: 15 to 25 vol %;

Gas pressure: $1.0\times10^{-2}$ Pa to $10\times10^{-2}$ Pa, preferably $1.0\times10^{-2}$ Pa to $5\times10^{-2}$ Pa, more preferably $1.0\times10^{-2}$ Pa to $3\times10^{-2}$ Pa)

Electric power applied (for each target): 30 to 1,000 W, preferably 50 to 750 W, more preferably 80 to 500 W Deposition rate: 2.0 to 50 nm/sec, preferably 2.5 to 35 nm/sec, more preferably 5 to 25 nm/sec

[Method (3) Using TaBSi Compound Target]

Sputtering gas: mixed gas of Ar, $O_2$ and $N_2$ ($O_2$ gas concentration: 5 to 30 vol %, $N_2$ gas concentration: 5 to 30 vol %, preferably $O_2$ gas concentration: 6 to 25 vol %, $N_2$ gas concentration: 6 to 25 vol %, more preferably $O_2$ gas concentration: 10 to 20 vol %, $N_2$ gas concentration: 15 to 25 vol %;

Gas pressure: $1.0\times10^{-2}$ Pa to $10\times10^{-2}$ Pa, preferably $1.0\times10^{-2}$ Pa to $5\times10^{-2}$ Pa, more preferably $1.0\times10^{-2}$ Pa to $3\times10^{-2}$ Pa)

Electric power applied: 30 to 1,000 W, preferably 50 to 750 W, more preferably 80 to 500 W Deposition rate: 2.0 to 50 nm/sec, preferably 2.5 to 35 nm/sec, more preferably 5 to 25 nm/sec It is preferred to form the low reflective layer 18 on the absorber layer 17 in the EUV mask blank 1' shown in FIG. 2, because the wavelength of the pattern inspection light and the wavelength of the EUV light are different. Thus, in a case where EUV light (in the vicinity of 13.5 nm) is used as the pattern inspection light, it is considered that it is not necessary to form the low reflective layer 18 on the absorber layer 17. The wavelength of the inspection light tends to shift toward a short wavelength side along with a reduction in the pattern dimension, and it is considered to shift to 193 nm or further to 13.5 nm in future. It is considered that it is not required to form the low reflective layer 18 on the absorber layer 17 when the wavelength of the inspection light is 13.5 nm.

The EUV mask blank of the present invention may have a functional film known in the field of the EUV mask blank, in addition to the reflective layer 12, the interlayer 13 of the double layer structure comprising the first layer 14 and the second layer 15, the protective layer 16, the absorber layer 17 and the low reflective layer 18. Specific examples of such a functional film include a highly dielectric coating to be applied on the back side of the substrate to accelerate electrostatic chucking of the substrate as disclosed in JP-A-2003-501823. Here, the back side of the substrate is meant for a face opposite to the face on which the reflective layer 12 is formed in the substrate 11 in FIG. 1. The electrical conductivity of a constituent material and the thickness of the highly dielectric coating to be applied on the back side of the substrate for the above purpose are selected so that the sheet resistance will be at most 100 Ω/□. As the constituent material of the highly dielectric coating can be widely selected from ones disclosed in known literature. For example, a highly dielectric coating as disclosed in JP-A-2003-501823, specifically, a coating comprising silicon, TiN, molybdenum, chromium or TaSi can be applied. The thickness of the highly dielectric coating may, for example, be from 10 to 1,000 nm.

The highly dielectric coating can be formed by a known film deposition method, e.g. sputtering such as magnetron sputtering method or ion beam sputtering method, a CVD method, a vacuum deposition method or an electrolytic plating method.

It is possible to produce the EUV mask of the present invention by patterning at least the absorber layer (the absorber layer and the low reflective layer in a case where the low reflective layer is formed on the absorber layer) of the EUV mask blank of the present invention. The method for patterning the absorber layer (the absorber layer and the low reflective layer in a case where the low reflective layer is formed on the absorber layer) is not particularly limited. For example, a method may be employed wherein a resist is applied on the absorber layer (the absorber layer and the low reflective layer in a case where the low reflective layer is formed on the absorber layer) to form a resist pattern, and by using this as a mask, the absorber layer (the absorber layer and the low reflective layer in a case where the low reflective layer is formed on the absorber layer) is subjected to etching. The material of the resist or the drawing method of the resist pattern may suitably be selected in consideration of the material, etc. of the absorber layer (the absorber layer and the low reflective layer in a case where the low reflective layer is formed on the absorber layer). The method for etching the absorber layer (the absorber layer and the low reflective layer in a case where the low reflective layer is formed on the absorber layer) is also not particularly limited, and dry etching such as reactive ion etching, or wet etching may be employed.

After patterning the absorber layer (the absorber layer and the low reflective layer in a case where the low reflective layer is formed on the absorber layer), the resist is removed by a resist-removing liquid to obtain the EUV mask of the present invention.

A process for producing a semiconductor integrated circuit by using the EUV mask of the present invention will be described. The present invention may be applied to a process for producing a semiconductor integrated circuit by photolithography using EUV light as the light source for exposure. Specifically, a substrate such as a silicon wafer coated with a resist is placed on a stage, and the above EUV mask is set on a reflection type exposure apparatus constituted by combining a reflecting mirror. And, EUV light from the light source is applied to the EUV mask via the reflecting mirror to let the EUV light be reflected by the EUV mask and applied to the substrate coated with the resist. By such a pattern transferring step, a circuit pattern is transferred onto the substrate. The substrate having the circuit pattern transferred, is subjected to etching of a sensitized portion or non-sensitized portion by development, and then, the resist is removed. A semiconductor integrated circuit is produced by repeating such a process.

EXAMPLES

Now, the present invention will be described in further detail with reference to Examples.

Example 1

In this Example, an EUV mask blank 1' shown in FIG. 2 was prepared.

As a substrate 11 for film deposition, a $SiO_2$—$TiO_2$ glass substrate (outer dimensions of 6 inch (152.4 mm) square and a thickness of 6.3 mm) was used. This glass substrate has a coefficient of thermal expansion of $0.2 \times 10^{-7}/°$ C., a Young's modulus of 67 GPa, a Poisson's ratio of 0.17 and a specific rigidity of $3.07 \times 10^7$ $m^2/s^2$. The glass substrate was polished so as to have a smooth surface with a surface roughness (rms) of at most 0.15 nm and a flatness of at most 100 nm.

On the back side of the substrate 11, a highly dielectric coating (not shown) with a sheet resistance of 100 Ω/□ was applied by depositing a Cr film with a thickness of 100 nm by magnetron sputtering method.

The substrate 11 (outer dimensions of 6 inch (152.4 mm) square and a thickness of 6.3 mm) was fixed to a conventional electrostatic chuck in a flat plate shape using the formed Cr film, and a cycle comprising alternately depositing Mo films and Si films on the surface of the substrate 11 by ion beam sputtering method was repeated 50 times to form a Mo/Si multilayer reflective film (reflective layer 12) having a total film thickness of 340 nm ((2.3 nm+4.5 nm)×50 times). The uppermost layer of the multilayer reflective film 12 was a Si film.

The deposition conditions for the Mo films and the Si films are as follows.
[Deposition Conditions for Mo Films]
  Target: Mo target
  Sputtering gas: Ar gas (gas pressure 0.02 Pa)
  Voltage: 700 V
  Deposition rate: 0.064 nm/sec
  Film thickness: 2.3 nm
[Deposition Conditions for Si Films]
  Target: Si target (doped with boron)
  Sputtering gas: Ar gas (gas pressure 0.02 Pa)
  Voltage: 700 V
  Deposition rate: 0.077 nm/sec
  Film thickness: 4.5 nm Then, the surface of the Si film as the uppermost layer of the Mo/Si multilayer reflective film was exposed to a nitrogen-containing atmosphere under the following conditions, in order to form a first layer of an interlayer.
[Exposure Conditions]
  Carrier gas: Ar gas, flow rate: 17 sccm
  Exposure gas: nitrogen gas, flow rate: 50 sccm
  (During RF discharge, nitrogen gas and carrier gas were supplied)
  Nitrogen gas partial pressure: 0.2 mTorr ($2.6 \times 10^{-2}$ Pa)
  Atmosphere pressure: 0.3 mTorr ($3.5$ Torr$\times 10^{-2}$ Pa)
  Atmosphere temperature: 20° C.
  Exposure time: 600 sec
  Exposure amount: $1.2 \times 10^5$ L (1 L (Langmuir)=$1 \times 10^{-6}$ Torr·s)

Then, a Ru layer as the protective layer 16 was formed by ion beam sputtering method.

The deposition conditions for the protective layer 16 are as follows.
  Target: Ru target
  Sputtering gas: Ar gas (gas pressure: 0.02 Pa)
  Voltage: 700 V
  Deposition rate: 0.052 nm/sec
  Film thickness: 2.5 nm By the formation of this protective layer 16, a second layer is formed on the first layer of the interlayer 13.

Then, a TaBSiN layer is formed as an absorber layer 17 on the protective layer 16 by magnetron sputtering method.

The deposition conditions for the TaBSiN layer are as follows.
[Deposition Conditions for TaBSiN Layer]
  Target: TaBSi compound target (compositional ratio: Ta 80 at %, B 10 at %, Si 10 at %)
  Sputtering gas: mixed gas of Ar and $N_2$ (Ar: 86 vol %, $N_2$: 14 vol %, gas pressure: 0.3 Pa)
  Electric power applied: 150 W
  Deposition rate: 0.12 nm/sec
  Film thickness: 60 nm Then, a TaBSiON layer is formed as a low reflective layer 18 on the absorber layer 17 by magnetron sputtering method to obtain an EUV mask blank 1' shown in FIG. 2.

The deposition conditions for the TaBSiON layer are as follows.
[Deposition Conditions for TaBSiON Layer)
  Target: TaBSi target (compositional ratio: Ta 80 at %, B 10 at %, Si 10 at %)
  Sputtering gas: mixed gas of Ar, $N_2$ and $O_2$ (Ar: 60 vol %, $N_2$: 20 vol %, $O_2$: 20 vol %; gas pressure: 0.3 Pa)

Electric power applied: 150 W
Deposition rate: 0.18 nm/sec
Film thickness: 10 nm With respect to the mask blank obtained by the above-described procedure, the following evaluations are carried out.

(1) Film Compositions

With respect to a sample formed up to the protective layer 16 by the above-described procedure, the compositions in the depth direction from the surface of the protective layer 16 to the reflective layer (Mo/Si multilayer reflective film) 12 were measured by means of an X-ray photoelectron spectrometer (Quantera SXM, manufactured by Ulvac-Phi Incorporated), to confirm that between Si film as the uppermost layer of the Mo/Si multilayer reflective film and the protective layer 16, an interlayer 13 of a double layer structure composed of a first layer 14 and a second layer 15 having the following compositions and thicknesses, are formed.

First layer: nitrogen 6 at %, Si 94 at %, thickness: 1 nm
Second layer: Ru 80 at %, Si 18 at %, nitrogen 2 at %, thickness: 1 nm Further, by the above measurement, it was confirmed that in the protective layer 16, the content of Si is 0 at %, and no Si is contained.

(2) Surface Roughness

With respect to a sample formed up to the protective layer 16 by the above-described procedure, the surface roughness of the protective layer 16 was confirmed by using an atomic force microscope (No. SPI3800, manufactured by Seiko Instruments Inc.) in accordance with JIS-B0601 (1994). The surface roughness (rms) of the protective layer 16 was 0.15 nm.

(3) Cleaning Durability

With respect to a sample formed up to the protective layer 16 by the above-described procedure, the surface of the protective layer 16 was treated by spin cleaning with ozone water for a total of 600 seconds. Before and after this treatment, the surface of the protective layer 16 was irradiated with EUV light (wavelength: 13.5 nm), and the EUV reflectance was measured by means of an EUV reflectance meter (MBR (product name) manufactured by AIXUV). The decrease in the EUV reflectance as between before and after the treatment was 0.4%.

(4) Heat Treatment Durability

To a sample formed up to the protective layer 16 by the above-described procedure, heat treatment (in the atmosphere) at 210° C. for 10 minutes was applied. The decrease in the EUV reflectance between before and after this treatment was 3.6%.

(5) Reflection Properties (Evaluation of Contrast)

With respect to a sample formed up to the protective layer 16 by the above-described procedure, the reflectance to pattern inspection light (wavelength: 257 nm) on the surface of the protective layer 16 is measured by means of a spectrophotometer. Further, with respect to a sample formed up to the low reflective layer 18, the reflectance to pattern inspection light on the surface of the low reflective layer 18 is measured. As a result, the reflectance on the surface of the protective layer 16 is 60.0%, and the reflectance on the surface of the low reflective layer 18 is 6.9%. By using these results and the above-described formula, the contrast is obtained to be 79.4%.

With respect to the obtainable EUV mask blank 1', the surface of the low reflective layer 18 is irradiated with EUV light (wavelength: 13.5 nm), and the reflectance to EUV light is measured. As a result, the reflectance to EUV light is 0.4%, and it is thus confirmed that the EUV absorption property is excellent.

(6) Etching Properties

The etching properties are evaluated by the following method instead of evaluation using the EUV mask blank prepared by the above procedure.

As a sample, a Si chip (10 mm×30 mm) having a Ru film or a TaBSiN film deposited, respectively, by the following methods, is placed on a sample support (4 inch quartz substrate) of a RF plasma etching apparatus. In such a state, RF plasma etching is carried out on the Ru film or the TaBSiN film on the Si chip placed on the sample support under the following conditions.

Bias RF: 50 W
Etching time: 120 sec
Trigger pressure: 3 Pa
Etching pressure: 1 Pa
Etching gas: $Cl_2$/Ar
Gas flow rate ($Cl_2$/Ar): 20/80 sccm
Distance between electrode substrates: 55 mm The deposition of the Ru film is carried out by ion beam sputtering method under the following deposition conditions.

[Deposition Conditions for Ru Film]
Target: Ru target
Sputtering gas: Ar gas (gas pressure: 2 mTorr, flow rate: 15 sccm)
Output: 150 W
Deposition rate: 0.023 nm/sec
Film thickness: 2.5 nm The TaBSiN film is deposited by magnetron sputtering method by simultaneously discharging a TaB target and a Si target in a nitrogen atmosphere. Here, the deposition is carried out under the following three types of conditions.

[Deposition Conditions (1) for TaBSiN Film]
Target: TaB target (compositional ratio: Ta 80 at %, B 20 at %), Si target
Sputtering gas: mixed gas of Ar and $N_2$ (Ar: 86 vol %, $N_2$: 14 vol %, gas pressure: 2 mTorr)
Output: 150 W (TaB target), 30 W (Si target)
Deposition rate: 0.13 nm/sec
Film thickness: 60 nm

[Deposition Conditions (2) for TaBSiN Film]
Target: TaB target (compositional ratio: Ta 80 at %, B 20 at %), Si target
Sputtering gas: Ar gas, $N_2$ gas (Ar: 86 vol %, $N_2$: 14 vol %, gas pressure: 2 mTorr)
Output: 150 W (TaB target), 50 W (Si target)
Deposition rate: 0.12 nm/sec
Film thickness: 60 nm

[Deposition Conditions (3) for TaBSiN Film]
Target: TaB target (compositional ratio: Ta 80 at %, B 20 at %), Si target
Sputtering gas: Ar gas, $N_2$ gas (Ar: 86 vol %, $N_2$: 14 vol %, gas pressure: 2 mTorr, flow rate: 13 sccm (Ar), 2 sccm ($N_2$))
Output: 150 W (TaB target), 100 W (Si target)
Deposition rate: 0.11 nm/sec
Film thickness: 60 nm With respect to the Ru film and the TaBSiN films (1) to (3) deposited under the above conditions, the etching rates are obtained, and the etching selectivity is obtained by using the following formula.

$$\text{Etching selectivity} = (\text{etching rate of TaBSiN film}) / (\text{etching rate of Ru film})$$

The etching selectivity to the protective layer 16 is preferably at least 10, and the etching selectivities of the TaBSiN films (1) to (3) are as follows, and each of them has a sufficient selectivity.
TaBSiN film (1): 10.0
TaBSiN film (2): 12.3
TaBSiN film (3): 13.9

Example 2

In Example 2, the surface of the Si film as the uppermost layer of the Mo/Si multilayer reflective film was exposed to a nitrogen-containing atmosphere in accordance with the following conditions. Here, except that the conditions for the exposure to a nitrogen-containing atmosphere were changed to the following conditions, the operation was carried out in the same manner as in Example 1.
[Exposure Conditions]
Carrier gas: Ar gas, flow rate: 17 sccm
Exposure gas: nitrogen gas, flow rate: 50 sccm
(During RF discharge, nitrogen gas and carrier gas were supplied)
Nitrogen gas partial pressure: 0.2 mTorr ($2.6 \times 10^{-2}$ Pa)
Atmosphere pressure: 0.3 mTorr ($3.5$ Torr$\times 10^{-2}$ Pa)
Atmosphere temperature: 20° C.
Exposure time: 6000 sec
Exposure amount: $1.2 \times 10^6$ L (1 L (Langmuir)=$1 \times 10^{-6}$ Torr·s)
With respect to a mask blank obtained by the above procedure, the following evaluations were carried out.
(1) Film Compositions
With respect to a sample formed up to the protective layer 16 by the above-described procedure, the compositions in the depth direction from the surface of the protective layer 16 to the reflective layer (Mo/Si multilayer reflective film) 12 were measured by means of an X-ray photoelectron spectrometer (Quantera SXM, manufactured by Ulvac-Phi Incorporated), to confirm that between Si film as the uppermost layer of the Mo/Si multilayer reflective film and the protective layer 16, an interlayer 13 of a double layer structure composed of a first layer 14 and a second layer 15 having the following compositions and thicknesses, are formed.
First layer: nitrogen 8 at %, Si 92 at %, thickness: 1 nm
Second layer: Ru 90 at %, Si 7.5 at %, nitrogen 2.5 at %, thickness: 1 nm
Further, by the above measurement, it was confirmed that in the protective layer 16, the content of Si is 0 at %, and no Si is contained.
(2) Surface Roughness
With respect to a sample formed up to the protective layer 16 by the above-described procedure, the surface roughness of the protective layer 16 was confirmed by using an atomic force microscope (No. SPI3800, manufactured by Seiko Instruments Inc.) in accordance with JIS-B0601 (1994). The surface roughness (rms) of the protective layer 16 was 0.15 nm.
(3) Cleaning Durability
With respect to a sample formed up to the protective layer 16 by the above-described procedure, the surface of the protective layer 16 was treated by spin cleaning with ozone water for a total of 600 seconds. Before and after this treatment, the surface of the protective layer 16 was irradiated with EUV light (wavelength: 13.5 nm), and the EUV reflectance was measured by means of an EUV reflectance meter (MBR (product name) manufactured by AIXUV). The decrease in the EUV reflectance as between before and after the treatment was 0.2%.

(4) Heat Treatment Durability
To a sample formed up to the protective layer 16 by the above-described procedure, heat treatment (in the atmosphere) at 210° C. for 10 minutes is applied. The decrease in the EUV reflectance between before and after this treatment is 3.2%.

Comparative Example 1

Comparative Example 1 was carried out in the same manner as in Example 1 except that after forming the reflective layer (Mo/Si multilayer reflective film) 12, the protective layer 16 was formed without exposing the Si film as the uppermost layer of the Mo/Si multilayer reflective film to a nitrogen-containing atmosphere.
With respect to a mask blank obtained by the above procedure, the following evaluations were carried out.
(1) Film Compositions
With respect to a sample formed up to the protective layer 16 by the above-described procedure, the compositions in the depth direction from the surface of the protective layer 16 to the reflective layer (Mo/Si multilayer reflective film) 12 were measured by means of an X-ray photoelectron spectrometer (Quantera SXM, manufactured by Ulvac-Phi Incorporated), whereby formation of an interlayer 13 was not confirmed between the Si film as the uppermost layer of the Mo/Si multilayer reflective film and the protective layer 16, and the nitrogen content in the laminate of the Si film and the protective film 16 was 0%.
(2) Surface Roughness
With respect to a sample formed up to the protective layer 16 by the above-described procedure, the surface roughness of the protective layer 16 was confirmed by using an atomic force microscope (No. SPI3800, manufactured by Seiko Instruments Inc.) in accordance with JIS-B0601 (1994). The surface roughness (rms) of the protective layer 16 was 0.15 nm.
(3) Cleaning Durability
With respect to a sample formed up to the protective layer 16 by the above-described procedure, the surface of the protective layer 16 was treated by spin cleaning with ozone water for a total of 600 seconds. Before and after this treatment, the surface of the protective layer 16 was irradiated with EUV light (wavelength: 13.5 nm), and the EUV reflectance was measured by means of an EUV reflectance meter (MBR (product name) manufactured by AIXUV). The decrease in the EUV reflectance as between before and after the treatment was 2.1%.
From this result, it was confirmed that the mask blank in Comparative Example 1 was inferior in the cleaning durability to the mask blanks in Examples 1 and 2.
(4) Heat Treatment Durability
To a sample formed up to the protective layer 16 by the above-described procedure, heat treatment (in the atmosphere) at 210° C. for 10 minutes was applied. The decrease in the EUV reflectance between before and after this treatment was 7.8%.
From this result, it was confirmed that the mask blank in Comparative Example 1 was inferior in the heat treatment durability to the mask blanks in Examples 1 and 2.

Comparative Example 2

Comparative Example 2 was carried out in the same manner as in Example 1 except that the Si film surface was exposed to an Ar gas atmosphere under the following exposure conditions instead of the nitrogen-containing atmosphere.

[Exposure Conditions]

Exposure gas: Ar gas, flow rate: 17 sccm (during RF discharge, Ar gas was supplied)

Atmosphere pressure: 0.1 mTorr (1.3 Torr×10$^{-2}$ Pa)

Atmosphere temperature: 20° C.

Exposure time: 600 sec

With respect to the mask blank obtained by the above-described procedure, the following evaluations were carried out.

(1) Film Compositions

With respect to a sample formed up to the protective layer 16 by the above-described procedure, the compositions in the depth direction from the surface of the protective layer 16 to the reflective layer (Mo/Si multilayer reflective film) 12 were measured by means of an X-ray photoelectron spectrometer (Quantera SXM, manufactured by Ulvac-Phi Incorporated), whereby formation of an interlayer 13 was not confirmed between the Si film as the uppermost layer of the Mo/Si multilayer reflective film and the protective layer 16, and the nitrogen content in the laminate of the Si film and the protective film 16 was 0%.

(2) Surface Roughness

With respect to a sample formed up to the protective layer 16 by the above-described procedure, the surface roughness of the protective layer 16 was confirmed by using an atomic force microscope (No. SPI3800, manufactured by Seiko Instruments Inc.) in accordance with JIS-B0601 (1994). The surface roughness (rms) of the protective layer 16 was 0.15 nm.

(3) Cleaning Durability

With respect to a sample formed up to the protective layer 16 by the above-described procedure, the surface of the protective layer 16 was treated by spin cleaning with ozone water for a total of 600 seconds. Before and after this treatment, the surface of the protective layer 16 was irradiated with EUV light (wavelength: 13.5 nm), and the EUV reflectance was measured by means of an EUV reflectance meter (MBR (product name) manufactured by AIXUV). The decrease in the EUV reflectance as between before and after the treatment was 2.9%.

From this result, it was confirmed that the mask blank in Comparative Example 2 was inferior in the cleaning durability to the mask blanks in Examples 1 and 2.

(4) Heat Treatment Durability

To a sample formed up to the protective layer 16 by the above-described procedure, heat treatment (in the atmosphere) at 210° C. for 10 minutes is applied. The decrease in the EUV reflectance between before and after this treatment is 7.8%.

From this result, it is confirmed that the mask blank in Comparative Example 2 is inferior in the heat treatment durability to the mask blanks in Examples 1 and 2.

Industrial Applicability

By the substrate with a reflective layer for EUV lithography of the present invention, the EUV mask blank using the substrate with a reflective layer, and the EUV mask obtained from such a blank, a decrease in the EUV light reflectance due to oxidation of the Ru protective layer is suppressed. And, by suppressing a change with time of the EUV light reflectance during the EUV exposure, the necessity to change the exposure conditions during the operation becomes less, and it becomes possible to prolong the useful life of the EUV mask.

Further, the EUV mask prepared by using the EUV mask blank of the present invention, is a highly reliable EUV mask with little change with time of the EUV light reflectance during the EUV exposure, and it is useful for the production of an integrated circuit having a fine pattern.

This application is a continuation of PCT Application No. PCT/JP2011/066993, filed on Jul. 26, 2011, which is based upon and claims the benefit of priority from Japanese Patent Application No. 2010-168298 filed on Jul. 27, 2010. The contents of those applications are incorporated herein by reference in its entirety.

Reference Symbols

1, 1': EUV mask blank
11: Substrate
12: Reflective layer
13: Interlayer
14: First layer
15: Second layer
16: Protective layer
17: Absorber layer
18: Low reflective layer

What is claimed is:

1. A substrate with a reflective layer for EUV lithography, comprising a substrate, and a reflective layer for reflecting EUV light and a protective layer for protecting the reflective layer formed in this order on the substrate, wherein
the reflective layer is a Mo/Si multilayer reflective film,
the protective layer is a Ru layer or a Ru compound layer,
between the reflective layer and the protective layer, an interlayer is formed which is composed of a first layer containing from 0.5 to 25 at % of nitrogen and from 75 to 99.5 at % of Si, and a second layer containing from 60 to 99.8 at % of Ru, from 0.1 to 10 at % of nitrogen and from 0.1 to 30 at % of Si and which has a total thickness of the first and second layers being from 0.2 to 2.5 nm,
the first layer constituting the interlayer is formed on the reflective layer side, and the second layer is formed on the first layer, and
the protective layer contains substantially no Si.

2. The substrate with a reflective layer for EUV lithography according to claim 1, wherein the first layer has a thickness of from 0.1 to 2.4 nm, the second layer has a thickness of from 0.1 to 2.4 nm, and the difference in thickness between the second layer and the first layer (i.e. thickness of the second layer-thickness of the first layer) is from 0 to 2.3 nm.

3. The substrate with a reflective layer for EUV lithography according to claim 1, wherein the surface roughness (rms) on the surface of the protective layer is at most 0.5 nm.

4. The substrate with a reflective layer for EUV lithography according to claim 2, wherein the surface roughness (rms) on the surface of the protective layer is at most 0.5 nm.

5. The substrate with a reflective layer for EUV lithography according to claim 1, wherein the protective layer has a thickness of from 1 to 10 nm.

6. The substrate with a reflective layer for EUV lithography according to claim 2, wherein the protective layer has a thickness of from 1 to 10 nm.

7. The substrate with a reflective layer for EUV lithography according to claim 3, wherein the protective layer has a thickness of from 1 to 10 nm.

8. The substrate with a reflective layer for EUV lithography according to claim 4, wherein the protective layer has a thickness of from 1 to 10 nm.

9. A reflective mask blank for EUV lithography, comprising the substrate with a reflective layer as defined in claim 1 and an absorber layer formed on the protective layer of the substrate.

10. The reflective mask blank for EUV lithography according to claim 9, wherein the absorber layer is formed of a material containing tantalum (Ta) as the main component.

11. The reflective mask blank for EUV lithography according to claim 9, wherein the etching selectivity for the absorber layer to the protective layer at the time of carrying out dry etching by means of chlorine type gas as etching gas, is at least 10.

12. The reflective mask blank for EUV lithography according to claim 10, wherein the etching selectivity for the absorber layer to the protective layer at the time of carrying out dry etching by means of chlorine type gas as etching gas, is at least 10.

13. The reflective mask blank for EUV lithography according to claim 9, wherein a low reflective layer to inspection light to be used for inspection of a mask pattern is formed of a material containing tantalum (Ta) as the main component on the absorber layer.

14. The reflective mask blank for EUV lithography according to claim 10, wherein a low reflective layer to inspection light to be used for inspection of a mask pattern is formed of a material containing tantalum (Ta) as the main component on the absorber layer.

15. The reflective mask blank for EUV lithography according to claim 11, wherein a low reflective layer to inspection light to be used for inspection of a mask pattern is formed of a material containing tantalum (Ta) as the main component on the absorber layer.

16. The reflective mask blank for EUV lithography according to claim 12, wherein a low reflective layer to inspection light to be used for inspection of a mask pattern is formed of a material containing tantalum (Ta) as the main component on the absorber layer.

17. The reflective mask blank for EUV lithography according to claim 13, wherein the contrast is at least 30% as between the reflected light on the surface of the protective layer and the reflected light on the surface of the low reflective layer at a wavelength of light to be used for inspection of a pattern to be formed on the absorber layer.

18. The reflective mask blank for EUV lithography according to claim 14, wherein the contrast is at least 30% as between the reflected light on the surface of the protective layer and the reflected light on the surface of the low reflective layer at a wavelength of light to be used for inspection of a pattern to be formed on the absorber layer.

19. A reflective mask for EUV lithography obtained by patterning the EUV mask blank as defined in claim 9.

20. A reflective mask for EUV lithography obtained by patterning the EUV mask blank as defined in claim 10.

\* \* \* \* \*